(12) United States Patent
Baluswamy et al.

(10) Patent No.: US 6,822,342 B2
(45) Date of Patent: Nov. 23, 2004

(54) RAISED-LINES OVERLAY SEMICONDUCTOR TARGETS AND METHOD OF MAKING THE SAME

(75) Inventors: Pary Baluswamy, Boise, ID (US); Scott J. DeBoer, Biose, ID (US); Ceredig Roberts, Boise, ID (US); Tim H. Bossart, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/996,337

(22) Filed: Nov. 28, 2001

(65) Prior Publication Data

US 2002/0036332 A1 Mar. 28, 2002

Related U.S. Application Data

(62) Division of application No. 09/651,790, filed on Aug. 30, 2000.

(51) Int. Cl.$^7$ .............................................. H01L 23/544
(52) U.S. Cl. ..................................................... 257/797
(58) Field of Search ......................... 257/797; 438/401, 438/462, 975

(56) References Cited

U.S. PATENT DOCUMENTS

| | | | |
|---|---|---|---|
| 5,128,283 A | | 7/1992 | Tanaka |
| 5,677,091 A | | 10/1997 | Barr et al. |
| 5,701,013 A | | 12/1997 | Hsia et al. |
| 5,786,260 A | * | 7/1998 | Jang et al. ................... 438/401 |
| 5,883,012 A | | 3/1999 | Chiou et al. |
| 5,908,319 A | | 6/1999 | Xu et al. |
| 5,923,041 A | | 7/1999 | Cresswell et al. |
| 6,022,650 A | | 2/2000 | Sogawa |
| 6,037,671 A | * | 3/2000 | Kepler et al. ................ 257/797 |
| 6,271,602 B1 | | 8/2001 | Ackmann et al. |

FOREIGN PATENT DOCUMENTS

| | | |
|---|---|---|
| JP | 58-90728 | 5/1983 |
| JP | 62-18714 | 1/1987 |

OTHER PUBLICATIONS

US 5,841,144, 11/1998, Cresswell (withdrawn).
Ghandhi, "VLSI Fabrication Principles Silicon and Gallium Arsenide", 2$^{nd}$ ed., 1994, John Wiley & Sons, Inc., New York, p. 589.

* cited by examiner

Primary Examiner—Long Pham
Assistant Examiner—Marcos D. Pizarro-Crespo
(74) Attorney, Agent, or Firm—TraskBritt

(57) ABSTRACT

The present invention includes a residue-free overlay target, as well as a method of forming a residue-free overlay target. The residue-free overlay target of the present invention is defined by trenches or pads including a series of raised lines. The raised lines included in the overlay target of the present invention substantially eliminate any surface topography, such as depressions, at the top surface of overlying material layers and, thereby, prevent accumulation of process residue which may obscure the overlay target and inhibit further processing. The method of the present invention may be accomplished and modified using process technology known in the semiconductor fabrication art and includes providing a semiconductor substrate, depositing a resist layer, patterning the resist, and executing a wet or dry etch to create at least one overlay target according to the present invention.

9 Claims, 11 Drawing Sheets

RAISED-LINES OVERLAY SEMICONDUCTOR TARGETS AND METHOD OF MAKING THE SAME

CROSS-REFERENCE TO RELATED APPLICATION

This application is a divisional of application Ser. No. 09/651,790, filed Aug. 30, 2000, pending.

BACKGROUND OF THE INVENTION

1. Field of the Invention

The present invention relates to the field of semiconductor device fabrication. Specifically, the present invention provides a residue-free overlay target which enables precise alignment of lithographic masks or reticles while substantially preventing residue build-up at the surface of the semiconductor substrate and eliminating process steps associated with known overlay targets.

2. State of the Art

As is well known, state of the art semiconductor memory and processing devices include multiple layers of electronic features which must be fabricated using multiple process steps. Individual features of state of the art semiconductor devices are generally defined by photolithographic processes wherein a resist is applied over the surface of a semiconductor substrate, or a material layer overlying a semiconductor substrate, and individual device features are patterned into the resist using a mask or reticle. After patterning the resist, the device features are permanently defined in the material layer being processed or the underlying semiconductor substrate by wet or dry etch steps. Advanced processes used to fabricate state of the art semiconductor devices may require as many as fifteen or more separate patterning and etching steps at varying layers during the fabrication process. However, in order to consistently fabricate functional and reliable semiconductor devices, it is necessary that each pattern be accurately aligned over the semiconductor substrate or material layer being processed and the feature dimensions must be precisely defined at each patterning and etch step. This is particularly true for state of the art semiconductor devices which require tolerances in the tens of nanometers range.

To help ensure that the device patterns are accurately positioned, a mask or reticle may be aligned using overlay targets located outside the chip pattern defined on the wafer being processed. Overlay targets are generally etched into the semiconductor substrate or into an overlying material layer and, therefore, become a permanent part of the wafer being processed. As new layers are deposited, patterned, and etched, the new masks or reticles used to process the new layers are often aligned by referencing back to the permanent overlay targets previously defined in an underlying material layer.

Manual or automated registration tools may be used for pattern alignment which is generally accomplished by aligning overlay targets with marks included on the mask or reticle used. In state of the art fabrication facilities, however, automated registration tools are preferred because of their accuracy and high throughput capabilities. To accomplish their taks, such automated registration tools must be able to readily detect the edges of the pattern formed by the overlay targets. Yet, as will be described hereinafter, known overlay targets enable intermittent accumulation of process residue which obscures the edges of the overlay target patterns, thereby substantially interfering with the proper function of registration tools.

Known overlay targets generally include a pattern formed by one or more etched trenches or pad areas. Illustrated in drawing FIG. 1 is a portion of an intermediate wafer structure 5 including a simple trench-type overlay target 10. The overlay target 10 includes a continuous rectangular trench 11 etched into the semiconductor substrate 14 outside the chip pattern 15. Of course, the overlay target depicted in drawing FIG. 1 is provided for illustrative purposes only. It is understood that overlay targets can be created using a variety of patterns formed from continuous trenches, discontinuous trenches, or pad areas.

Depicted in drawing FIG. 2 is a cross-section taken at line A—A of drawing FIG. 1, illustrating an overlying material layer 16 deposited over the surface 18 of the semiconductor substrate 14 after formation of the trench 11 defining the overlay target. As can be seen in drawing FIG. 2, the overlying material layer 16 tends to conform to the topography created by the trench 11. Such conformation results in the formation of depressions 20 at the upper surface 22 of the overlying material layer 16. Even after a polishing step, portions 24 (shown in drawing FIG. 3) of the depressions 20 may still remain and serve as collection points for process residue 26 (also shown in FIG. 3), such as hemispherical grain ("HSG") Poly. As is shown in drawing FIG. 4, because the residue 26 overlies the trench 11 defining overlay target 10, the residue 26 works to obscure the outlines (depicted by dashed lines 28a and 28b) of the pattern formed by the trench 11, making the outlines 28a and 28b of the overlay target 10 to appear ragged or inconsistent. Though drawings FIG. 2 through FIG. 4 depict features associated with a trench-type overlay target, intermittent collection of obscuring residue is also an issue of pad-type overlay targets and overlay targets including one or more trenches or pads.

Though the build-up of process residue over an overlay target may occur only intermittently across the surface of a wafer, even one obscured overlay target may render mask or reticle alignment impossible or, at best, imprecise. For this reason, the surface of an incomplete wafer must be periodically cleaned, such as by patterning and etching steps, in order to ensure each of the overlay targets formed in the wafer are clean and easily registered by a registration tool. As is easily appreciated, such cleaning steps add time and cost to the fabrication process. Therefore, an overlay target which does not lead to the collection of obscuring process residue would be an improvement in the art, obviating the cost and delay associated with the cleaning steps currently undertaken to ensure the proper registration of overlay targets.

SUMMARY OF THE INVENTION

The present invention includes a residue-free overlay target, as well as a method of forming a residue-free overlay target, which answer the foregoing needs. The trenches or pads forming the residue-free overlay target of the present invention are broken down into a series of smaller raised lines which substantially eliminate any surface topography, such as depressions, at the top surface of overlying material layers. The residue-free overlay target of the present invention, therefore, prevents the formation of surface features which could serve as collection points for obscuring process residue, thereby eliminating the need to perform the intermediate cleaning steps otherwise necessary to ensure registration of overlay targets.

The method of forming a residue-free overlay target of the present invention may be accomplished and modified using process technology known in the semiconductor fabrication art. The method of the present invention includes providing a semiconductor substrate having top and bottom surfaces, depositing a resist layer, exposing the resist layer using a mask or reticle creating a resist pattern corresponding to at least one overlay target according to the present invention, developing the resist pattern, and executing a wet or dry etch to create at least one overlay target including a trench or pad area including a series of raised lines. As will be understood by those of skill in the art, the method of the present invention may be used to create overlay targets having a variety of patterns suitable for different semiconductor device fabrication processes, as well as different manual or automated registration tools. Moreover, the method of the present invention is easily modified for the fabrication of overlay targets in a variety of substrates.

Other features and advantages of the present invention will become apparent to those of skill in the art through a consideration of the ensuing description, the accompanying drawings, and the appended claims.

BRIEF DESCRIPTION OF THE DRAWINGS

The Figures presented in conjunction with this description are not actual views of any particular portion of an actual semiconductor device or component, but are merely representations employed to more clearly and fully depict the present invention.

DETAILED DESCRIPTION OF THE INVENTION

The present invention includes a residue-free overlay target useful in the fabrication of state of the art semiconductor devices. The overlay target of the present invention includes one or more trenches or pad areas including a series of raised lines which substantially prevent subsequently deposited material layers from conforming to the topography of the overlay target. Because the subsequently deposited material layers do not conform to the overlay target topography, the overlay target of the present invention prevents formation of surface topography which could serve to collect obscuring process residue. Thus, the overlay target of the present invention simplifies current fabrication methods by eliminating the cleaning steps otherwise necessary to remove accumulated process residue and ensure registration of overlay targets after deposition and processing of subsequently applied material layers.

Figure 1:
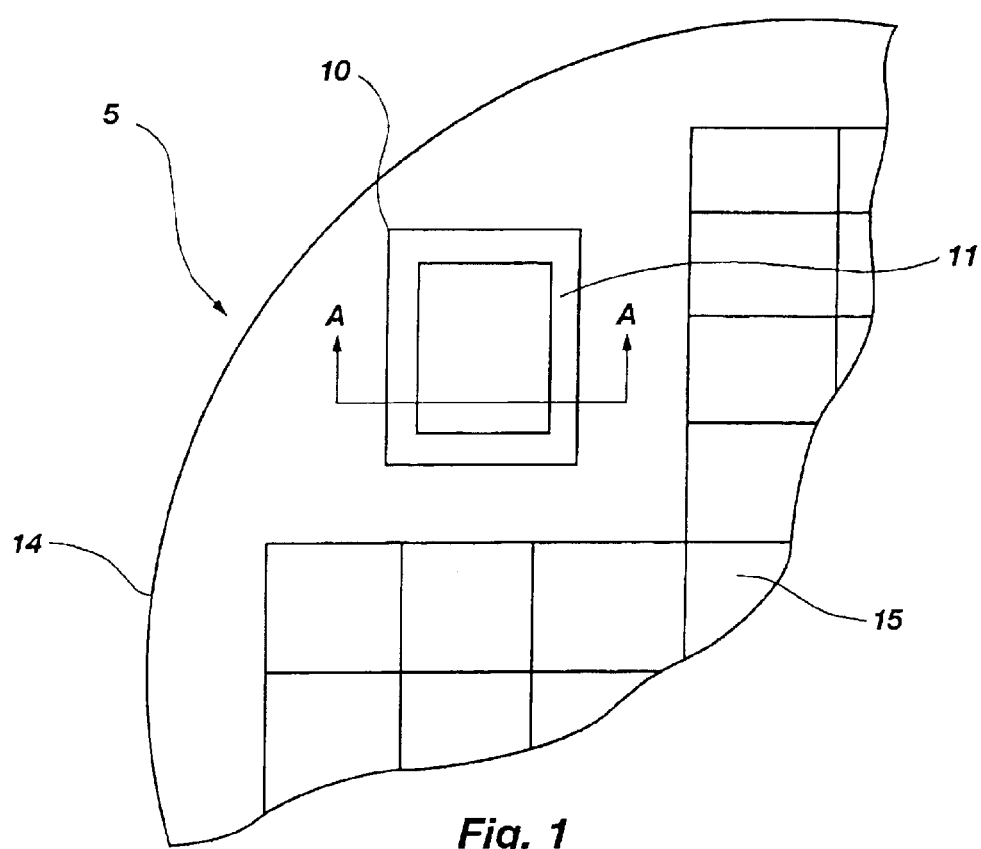
FIG. 1 provides a top view of a portion of a prior art semiconductor wafer including an overlay target and a portion of the chip pattern formed on the semiconductor wafer.
Figure 2:
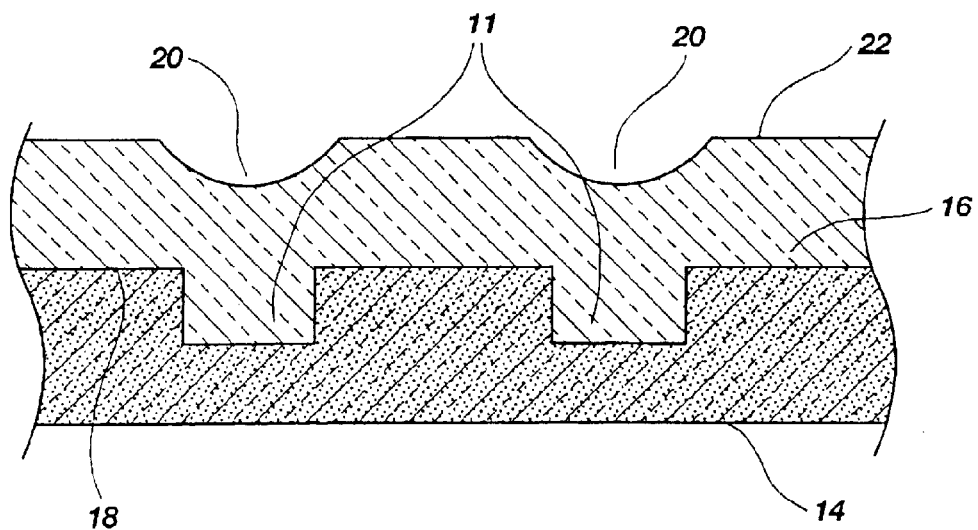
FIG. 2 depicts a cross-section of a portion of the prior art structure illustrated in FIG. 1, the cross-section being taken at line A—A of FIG. 1 and after an additional material layer is formed over the overlay target.
Figure 3:
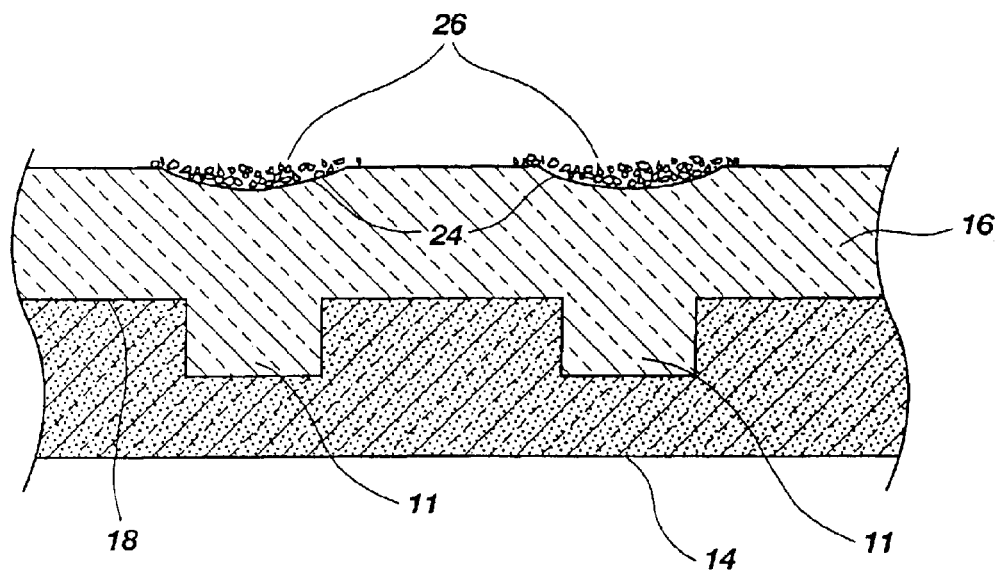
FIG. 3 depicts the same prior art structure as shown in FIG. 2 after the additional material layer has undergone a polishing process.
Figure 4:
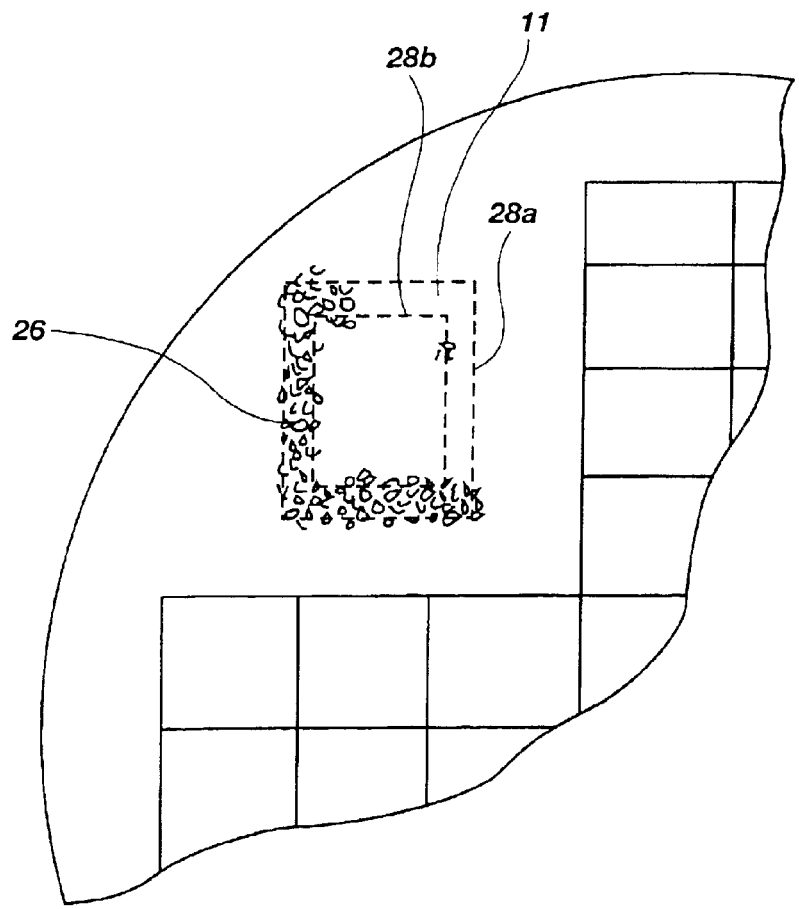
FIG. 4 provides a top view of the same portion of a prior art semiconductor wafer as is depicted in FIG. 1 after an additional material layer has been deposited over the overlay target and the additional material layer has been subjected to a polishing step.
Figure 5:
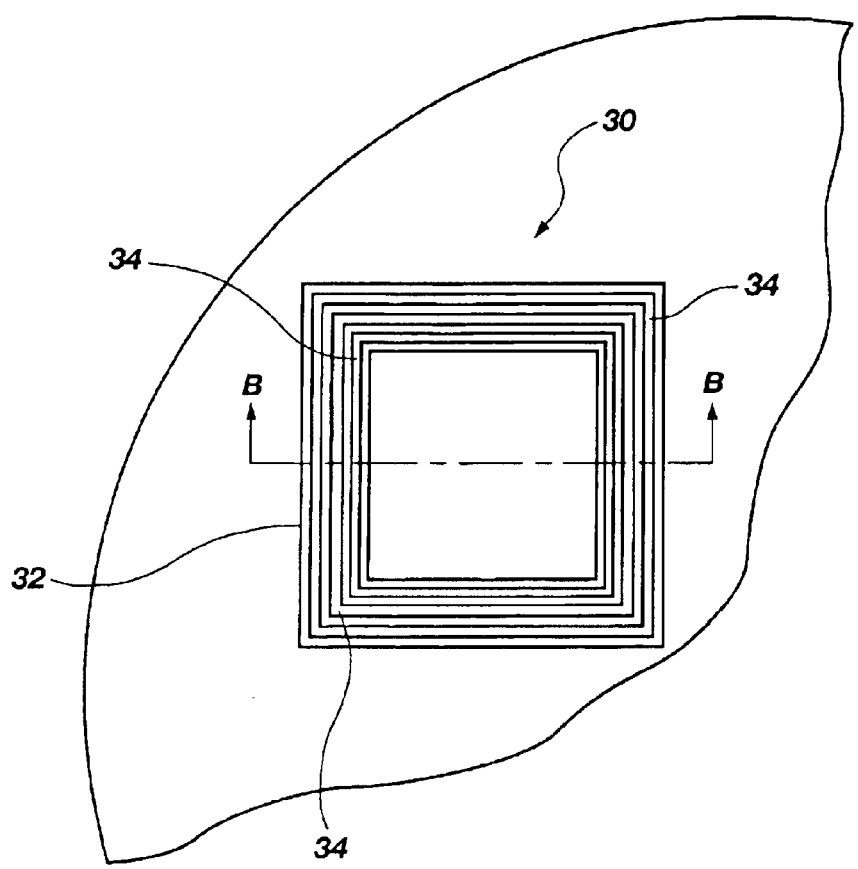
FIG. 5 provides a top view of a portion of a semiconductor wafer having an overlay target according to a first embodiment of the overlay target of the present invention formed thereon.
Figure 6:
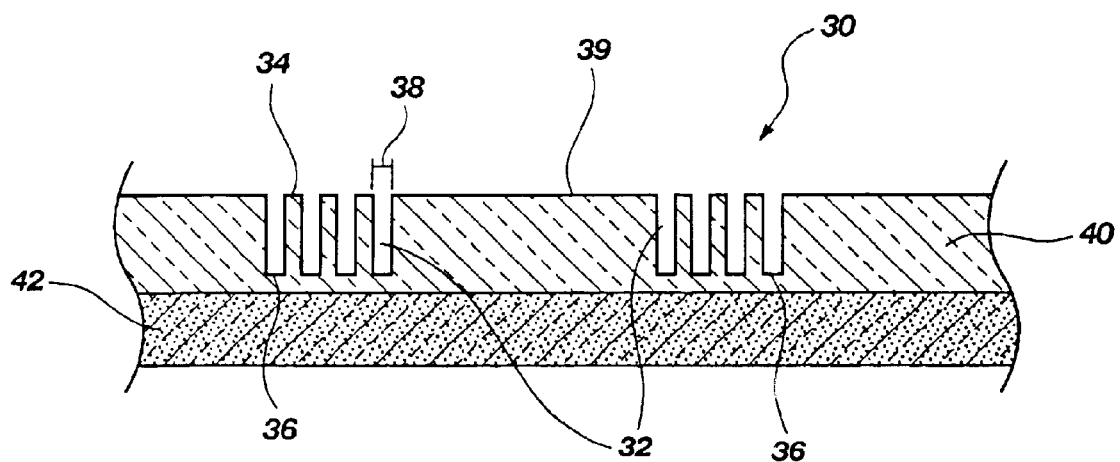
FIG. 6 depicts a cross-section of a portion of the structure illustrated in FIG. 5, the cross-section being taken at line B—B of FIG. 5.

In a first embodiment, illustrated in drawing FIG. 5, the overlay target 30 of the present invention includes a continuous trench 32 having a plurality of raised lines or substantially vertically extending ribs or protrusions 34 disposed therein or from the bottom of the trench thereof. As can be seen in drawing FIG. 6, a cross-section of the overlay target 30 taken at line B—B of drawing FIG. 5, the raised lines 34 disposed within the continuous trench 32 originate at the bottom surface 36 of the continuous trench 32 and are defined by alternating spaces 38 etched into surface 39 of a first material layer 40 deposited over the semiconductor wafer 42. Although drawings FIG. 5 and FIG. 6 illustrate an overlay target 30 including only a single continuous trench 32 forming a generally rectangular pattern, it should be understood that one or more continuous trenches may be used to form an overlay target of the present invention and that such trenches may be configured in a variety of shapes or sizes to meet any particular processing need.

Figure 7:
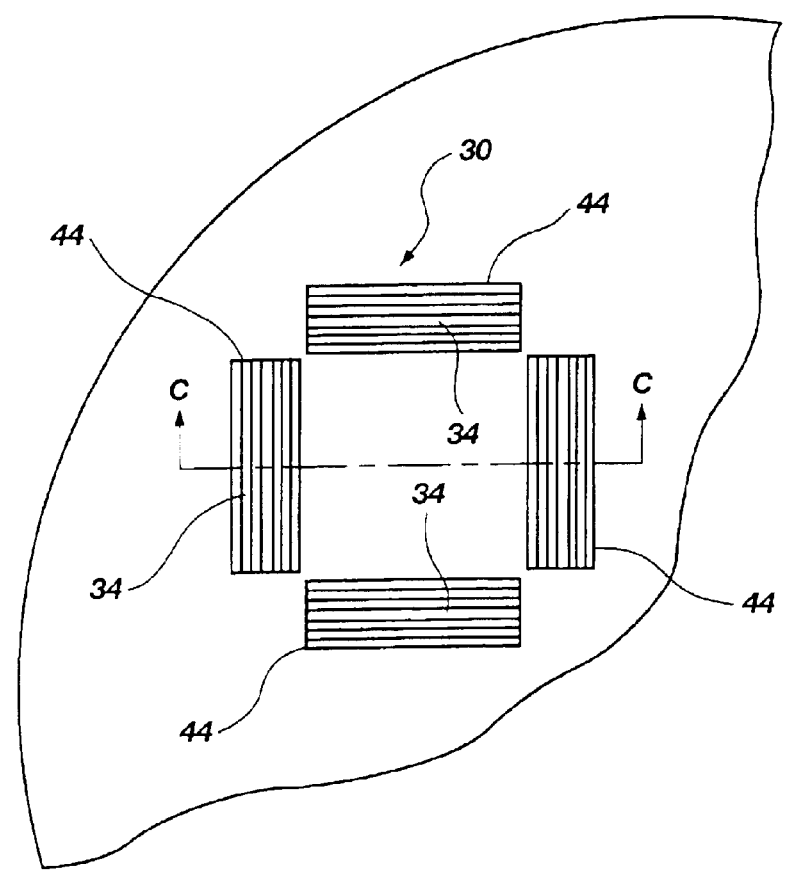
FIG. 7 provides a top view of a portion of a semiconductor wafer having an overlay target according to a second embodiment of the overlay target of the present invention formed thereon.
Figure 8:
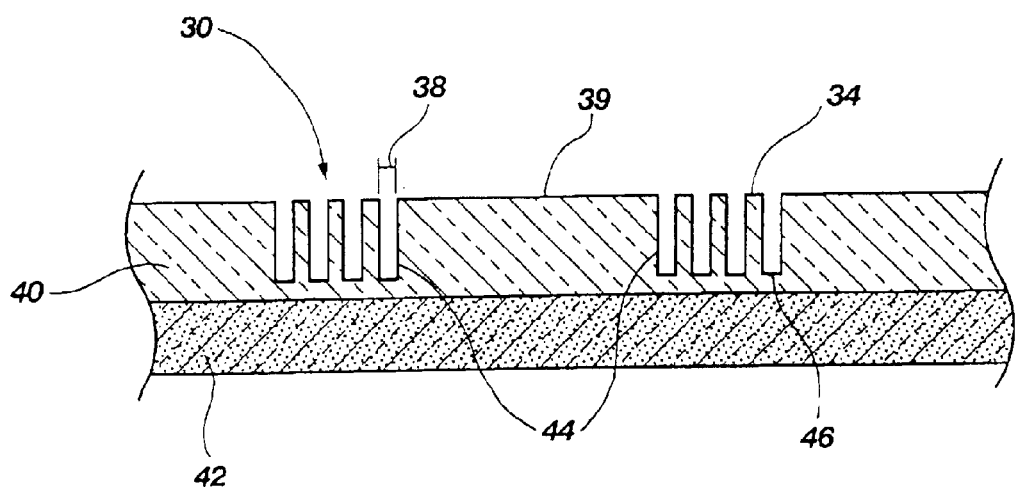
FIG. 8 depicts a cross-section of a portion of the structure illustrated in FIG. 7, the cross-section being taken at line C—C of FIG. 7.

In another embodiment illustrated in drawing FIG. 7, the overlay target 30 includes a plurality of discontinuous trenches 44 creating a pattern that can be evaluated by a registration tool. The discontinuous trenches 44 of the second embodiment each include a series of raised lines 34, and as can be clearly seen in drawing FIG. 8, a cross-section taken at line C—C of drawing FIG. 7, the raised lines 34 originate from the bottom surfaces 46 of each discontinuous trench 44 and are defined by alternating spaces 38 etched into the surface 39 of a first material layer 40 deposited over the semiconductor wafer 42. Although the discontinuous trenches 44 of the overlay target 30 illustrated in drawing FIG. 7 form a generally rectangular outline, it should be understood that the overlay target of the present invention may also include a plurality of discontinuous trenches disposed in any other pattern suitable for a particular fabrication process or registration tool.

Figure 9:
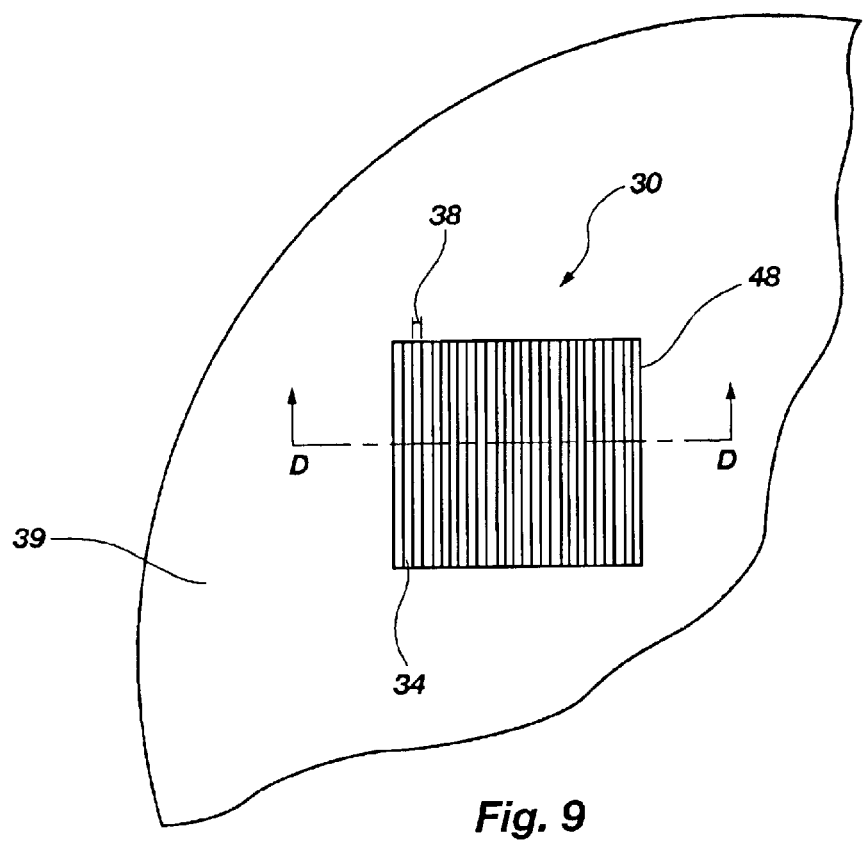
FIG. 9 provides a top view of a portion of a semiconductor wafer having an overlay target according to a third embodiment of the overlay target of the present invention formed thereon.
Figure 10:
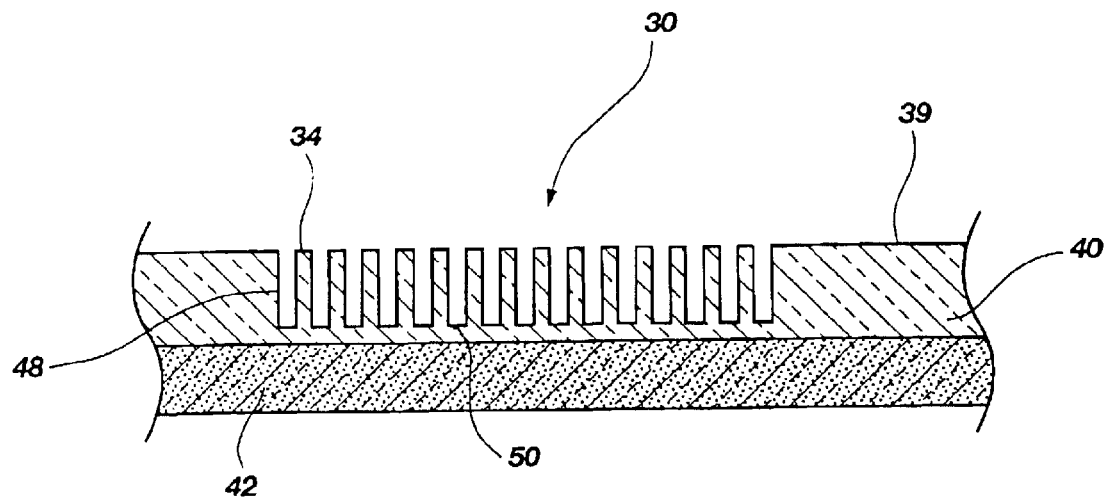
FIG. 10 depicts a cross-section of a portion of the structure illustrated in FIG. 9, the cross-section being taken at line D—D of FIG. 9.

A third embodiment of the overlay target 30 of the present invention is illustrated in drawing FIG. 9. The third embodiment of the overlay target of the present invention is similar to the previous two embodiments except that instead of continuous or discontinuous trenches, the overlay target 30 of the third embodiment includes a pad area 48 including a plurality of raised lines 34 defined by a plurality of alternating spaces 38 etched into the surface 39 of a first material layer 40 deposited over a semiconductor wafer 42 (as shown in drawing FIG. 10, a cross-section taken at line D—D of drawing FIG. 9). As can be seen in drawing FIG. 10, the raised lines 34 within the pad area 48 originate at the bottom surface 50 of the pad area 48.

It is significant to note that even though the three preceding embodiments of the overlay target of the present invention include either one or more continuous trenches, a plurality of discontinuous trenches, or a pad area, the overlay target of the present invention is not so limited. The overlay target of the present invention may include more than one pad area, one or more continuous trenches in combination with one or more discontinuous trenches, one or more pad areas in combination with one or more continuous trenches and one or more discontinuous trenches, or one or more pad areas in combination with one or more continuous trenches or one or more discontinuous trenches. As will be understood by one of skill in the art, any combination of continuous trenches, discontinuous trenches, or pad areas may be used, provided that each trench or pad area includes a series of spaced, raised lines and each overlay target forms a pattern that can be evaluated by a registration tool.

Figure 11:
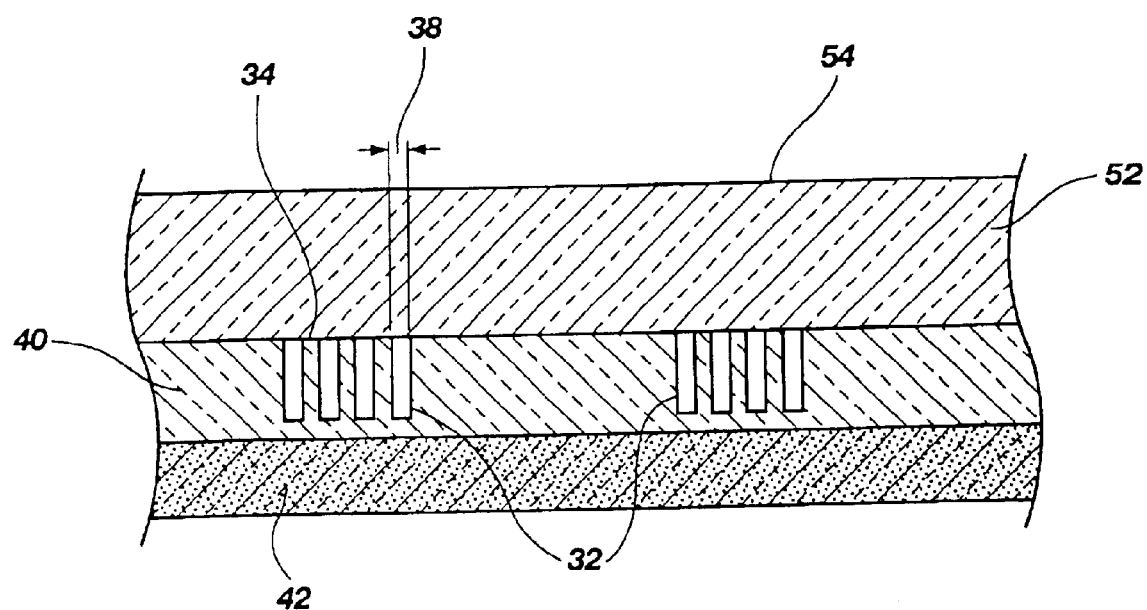
FIG. 11 depicts a cross-section of the same structure illustrated in FIG. 6 after an additional material layer has been deposited over the semiconductor wafer.

The spaced raised lines included in each of the trenches or pad areas of an overlay target of the present invention substantially prevent overlying material layers from conforming to the topography of the overlay target. Illustrated in drawing FIG. 11 is the same cross-section of material illustrated in drawing FIG. 6 after a second material layer 52 has been deposited over the surface 39 of the first material layer 40, which has been etched to include the overlay target 30. The spaces 38 defining the raised lines 34 of the overlay target of the present invention are sufficiently narrow that the second material layer 52 does not substantially conform to the topography of the overlay target 30. As a result, the topography of the overlay target 30 is not transferred to the second material layer, and the top surface 54 of the second material layer 52 does not include depressions which collect process residue in sufficient quantities to interfere with the operation of a registration tool. Therefore, the raised lines of the overlay target of the present invention eliminate periodic cleaning steps which would otherwise be necessary to ensure the overlay targets are accurately evaluated by a registration tool.

Additionally, the spaces defining the raised lines included in each of the trenches or pad areas of an overlay target of the present invention may be of various widths. For example, the widths of the spaces defining the raised lines may be increased where a less conforming material is deposited over the overlay target, or the widths of the spaces defining the raised lines may be decreased where a highly conforming material is deposited over the overlay target. Moreover, the widths of the spaces defining the raised lines included in the overlay target of the present invention may be varied depending on the capabilities of the registration tool used.

Although drawings FIG. 5 through FIG. 11 depict overlay targets etched into the first material layer applied over a semiconductor wafer, it should be understood that the overlay target may also be etched directly into the surface of the semiconductor substrate. Alternatively, as two or more sets of overlay targets are generally used to complete fabrication of state of the art semiconductor devices, an overlay target according to the present invention may also be created in material layers deposited after a first material layer has been deposited and processed as needed.

Figure 13:
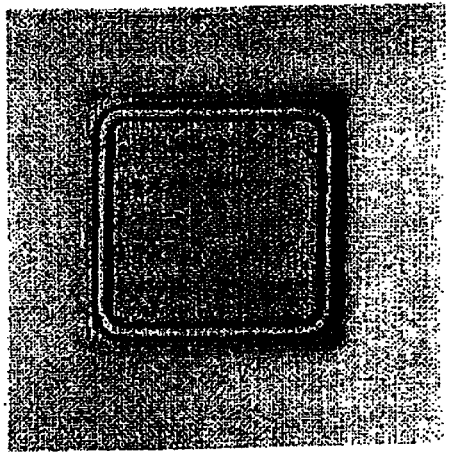
FIG. 13 is a micrograph taken at higher magnification showing the same top view of the prior art overlay target depicted in FIG. 12 after the semiconductor wafer has been subjected to a cleaning process.
Figure 14:
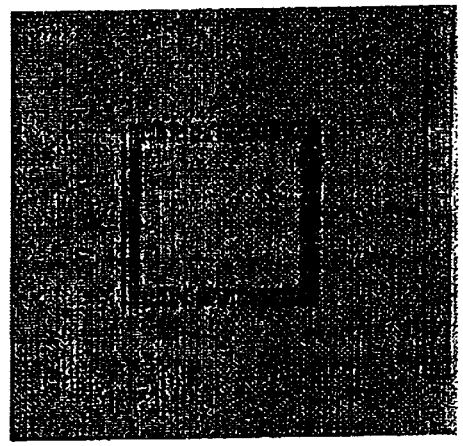
FIG. 14 is a micrograph showing a top view of an overlay target according to the present invention.
Figure 12:
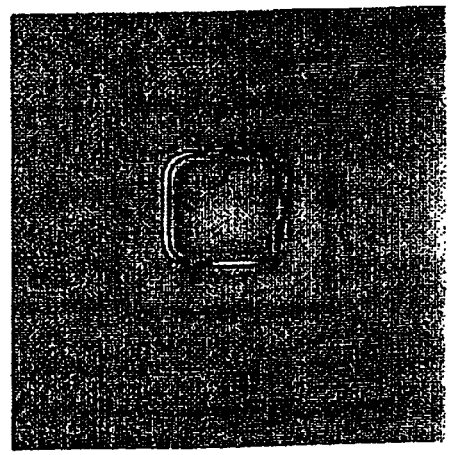
FIG. 12 is a micrograph showing a top view of a prior art overlay target obscured by accumulated process residue.

A useful comparison is illustrated in drawings FIG. 12, FIG. 13 and FIG. 14 showing the desirability of an overlay target according to the present invention. Provided in drawing FIG. 12 is a micrograph of a top view of a trench-type overlay target as seen through a subsequently applied material layer. The continuous trench forming the overlay target of drawing FIG. 12 lacks the raised lines of the overlay target of the present invention and, therefore, the topography of the trench has transferred to the top surface of the subsequently applied material layer, resulting in a depression in the top surface of the subsequently applied material layer corresponding to the trench forming the overlay target. As can be seen in drawing FIG. 12, during a polishing step, process residue, HSG Poly in this case, has collected in the depression corresponding to the overlay target trench, and the outline of the overlay target appears ragged and inconsistent.

To ensure that the overlay target shown in drawing FIG. 12 is properly read, the semiconductor wafer must be subjected to a cleaning process. For example, the semiconductor wafer may be cleaned by depositing a layer of resist over the semiconductor wafer, exposing and developing the resist to create a photoresist mask exposing the area(s) to be cleaned, etching the exposed area(s) of the semiconductor wafer, and stripping the photoresist mask after the etching process is complete. FIG. 13 provides a second micrograph at higher magnification of a top view of the trench shown in drawing FIG. 12 after the semiconductor wafer has been cleaned by such a process and, as is easily ascertainable from drawing FIG. 13, the outlines of the overlay target are clearly discernible through the overlying material layer after the cleaning process. The need to clean the surface of the wafer being processed adds several process steps that increase fabrication cost and decrease throughput.

Provided in drawing FIG. 14 is a micrograph of a top view of an overlay target of the present invention as seen through an overlying material layer. As was the case with the structure depicted in drawing FIG. 12, the overlying material layer of the structure pictured in drawing FIG. 14 has been subjected to a polishing step. However, because the raised lines (not discernible in drawing FIG. 14) included in the trenches of the overlay target shown in drawing FIG. 14 prevent the overlying layer from conforming to the topography of the overlay target, the top surface of the overlying material layer does not include depressions that collect process residue and, as a result, no process residue obscures the features of the overlay target depicted in drawing FIG. 14. Therefore, the overlay target of the present invention is easily evaluated by registration machinery without additional cleaning steps, such as those described in relation to drawing FIG. 13, resulting in advantageous cost savings as well as an increase in throughput.

Figure 15:
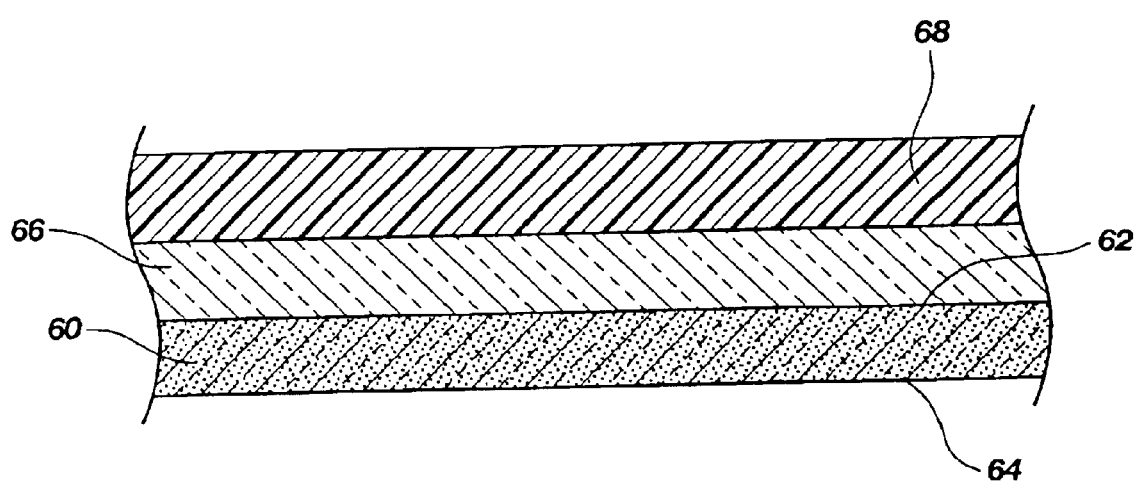
FIG. 15–FIG. 18 illustrate various structures at different steps of a method according to the first embodiment of the method of the present invention.
Figure 16:
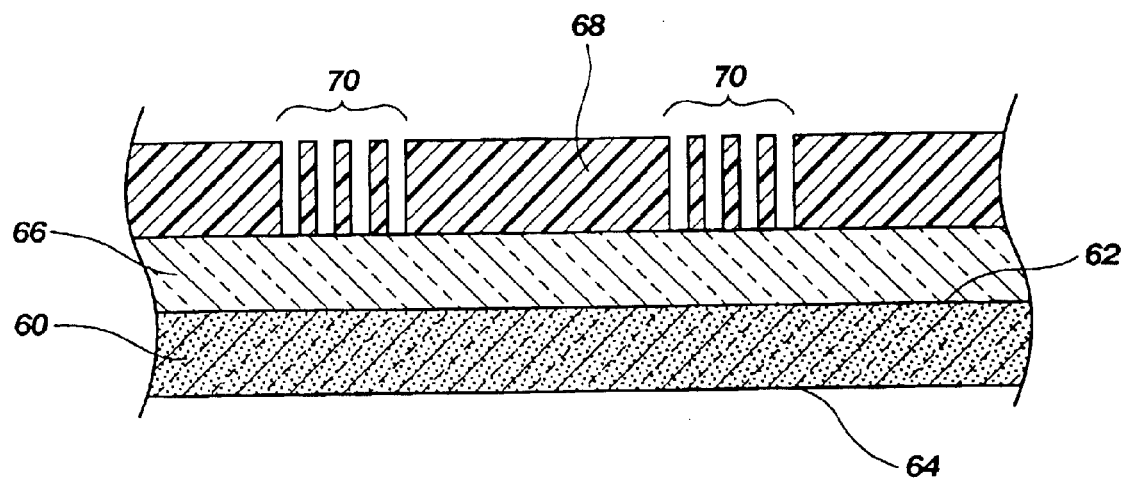
Figure 17:
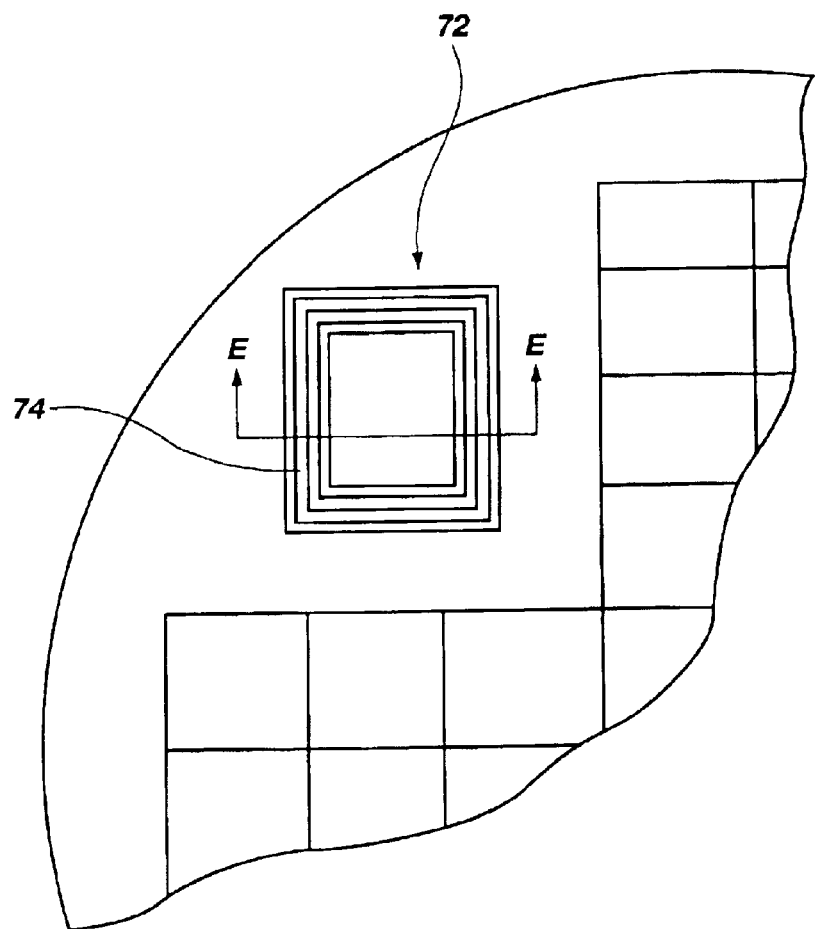
Figure 18:
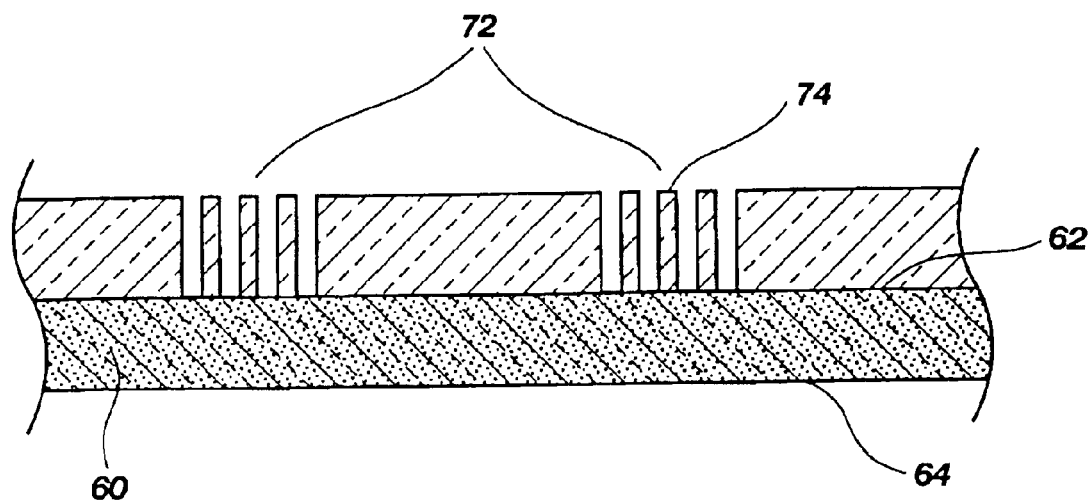
Figure 22:
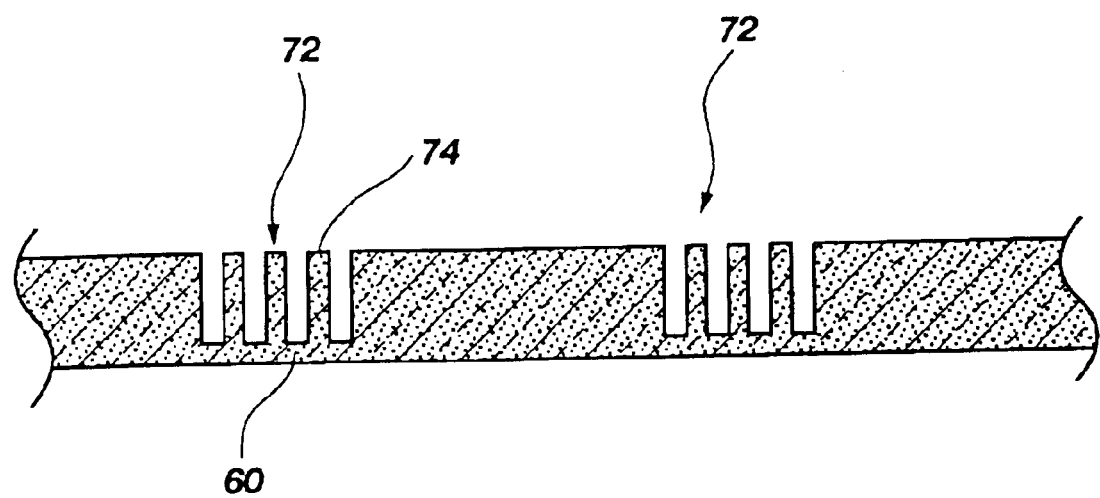

The present invention also includes a method for forming an overlay target, which will be described in relation to drawing FIG. 15 through drawing FIG. 22. A first embodiment of the method of the present invention includes providing a semiconductor substrate 60 having top surface 62 and a bottom surface 64. The semiconductor substrate 60 may be made from any suitable material, such as silicon, gallium, or sapphire materials, and the semiconductor substrate 60 may include one or more doped regions. A material layer 66, such as a borophosilicate glass layer or other dielectric, is then deposited over the top surface 62, and a layer of resist 68 is deposited over the material layer 66. The layer of resist 68 may include any suitable resist known in the art, and the resist layer may be applied by any known means, such as known spin coating processes. As shown in drawing FIG. 16, the layer of resist 68 is then exposed and developed as is known in the art to provide a resist pattern 70 that will result in a desired overlay target. The material layer 66 deposited over the top surface 62 of the semiconductor substrate 60 is then etched, for example, by an $NF_3$ or a chlorine etch, providing an overlay target 72 of the present invention including a plurality of raised lines 74, as can be seen in drawing FIG. 17 and drawing FIG. 18, a cross-section taken at line E—E of drawing FIG. 17.

Though this first embodiment of the method of the present invention has been illustrated using a first material layer as the layer in which the overlay target is fabricated, the first embodiment of the method of the present invention is not so limited. The material layer used for creation of the overlay target need not be the first material layer deposited over the semiconductor substrate. The method according to the first embodiment may also be used to produce overlay targets in any material layer overlying the semiconductor substrate.

Figure 19:
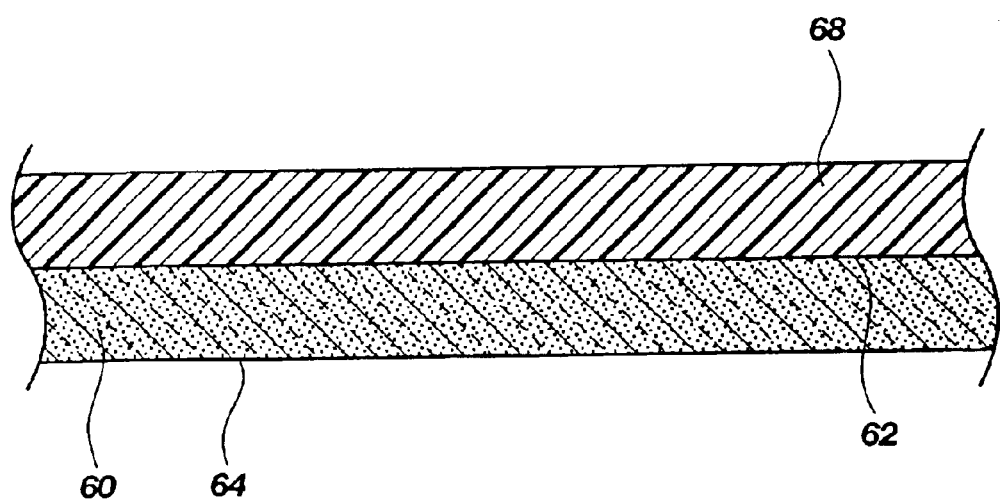
FIG. 19–FIG. 22 illustrate various structures at different steps of a method according to the second embodiment of the method of the present invention.
Figure 20:
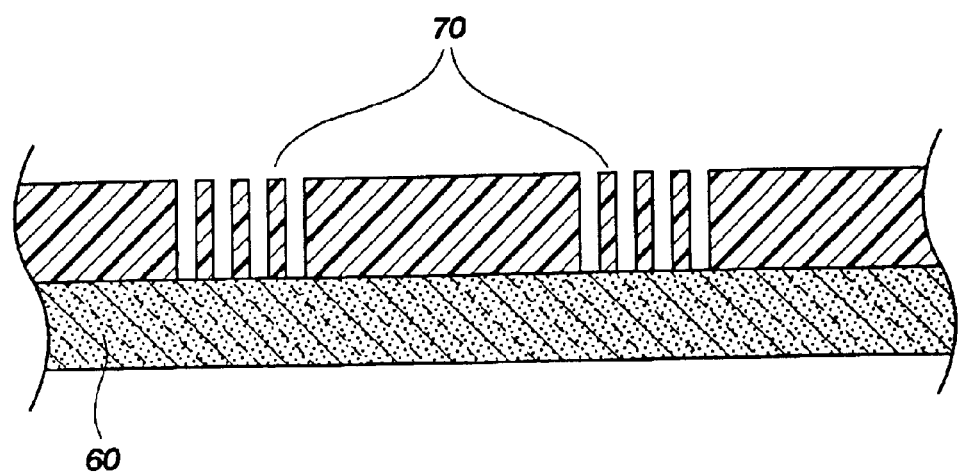
Figure 21:
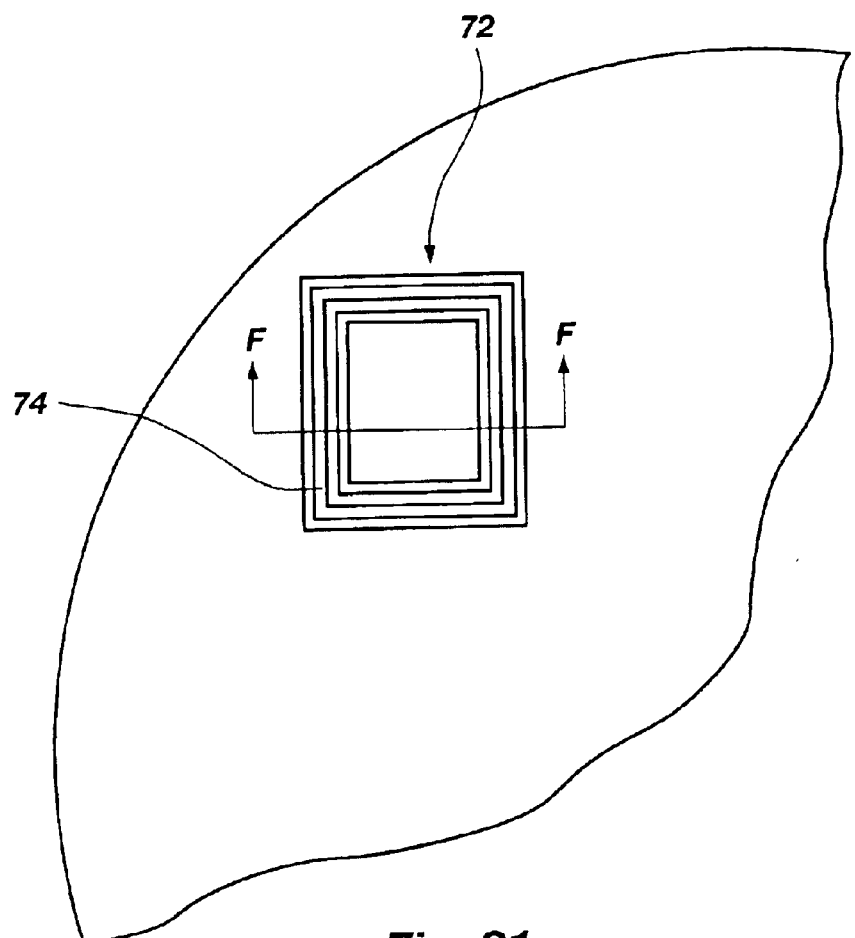

In a second embodiment of the method of the present invention the overlay target is etched directly into the semiconductor substrate 60. Thus, as is shown in drawing FIG. 19, the method according to the second embodiment requires providing a semiconductor substrate 60 having a top surface 62 and a bottom surface 64 and depositing a layer of resist 68 over the top surface 62 of the semiconductor substrate 60. Again the semiconductor substrate 60 may constitute any suitable semiconductor material, such as those described in relation to the first embodiment. Further, any suitable resist, such as those already described, may be used, and the layer of resist 68 may be deposited by any appropriate method for the resist material used, such as spinning. After the layer of resist 68 is deposited, the layer of resist 68 is exposed and developed as is known in the art to form a resist pattern 70 (shown in drawing FIG. 20) that will result in a desired overlay target after etching. The semiconductor substrate 60 is then etched by any known process suitable for the material used to form the semiconductor substrate 60, for example, an $NF_3$ or a chlorine etch. As can be seen in drawing FIG. 21 and drawing FIG. 22, a cross-section of drawing FIG. 21 taken at line F—F, etching the semiconductor substrate 60 provides an overlay target 72 according to the present invention including a plurality of raised lines 74.

It will be easily understood by one of ordinary skill in the art that the method of the present invention is extremely flexible. The method of the present invention is easily adapted to create overlay targets in a variety of substrates using known patterning and etching processes. Moreover, the method of fabricating an overlay target of the present invention may be used to fabricate overlay targets comprising virtually any suitable target pattern.

Though the overlay targets and method of the present invention have been described herein with reference to specific examples, such examples are for illustrative purposes only. The scope of the present invention is defined by the appended claims and is, therefore, not limited by the preceding description and drawings.

What is claimed is:

1. An overlay target for reducing residue therein from processes for forming semiconductor devices on a wafer comprising:

a material surface;

at least three rectangular elongated registration features having adjacent sides of unequal length in said material surface, said at least three rectangular elongated registration features each having a bottom surface, a series of substantially vertically extending laterally continuous raised lines originating at said bottom surface of each of said at least three rectangular elongated registration features, substantially all of said raised lines having surfaces which are substantially coplanar with said material surface, and a series of trenches disposed between said raised lines within each of said at least three rectangular elongated registration features, said at least three rectangular elongated registration features defining a perimeter of a geometric shape, said at least three rectangular elongated registration features comprising four rectangular elongated registration features defining said overlay target, each of said four rectangular elongated registration features including said series of substantially vertically extending laterally continuous raised lines originating at said bottom surface of each of said at least three registration features, and said series of trenches disposed between said raised lines within said four rectangular elongated registration features, said four rectangular elongated registration features defining a continuous perimeter of a rectangle.

2. An overlay target comprising:

a material surface;

at least three rectangular elongated registration features having adjacent sides of unequal length in said material surface, said at least three rectangular elongated registration features each having a bottom surface, a series of substantially vertically extending laterally continuous raised lines originating at said bottom surface of each of said at least three rectangular elongated registration features, substantially all of said raised lines having surfaces which are substantially coplanar with said material surface, and a series of trenches disposed between said raised lines within each of said at least three rectangular elongated registration features, said at least three rectangular elongated registration features defining a perimeter of a geometric shape, said at least three rectangular elongated registration features comprising four rectangular elongated registration features defining said overlay target, each of said four rectangular elongated registration features including said series of substantially vertically extending laterally continuous raised lines originating at said bottom surface of each of said at least three registration features, and said series of trenches disposed between said raised lines within each of said four rectangular elongated registration features, said four rectangular elongated registration features defining a continuous perimeter of a rectangle.

3. An overlay target comprising:

a material surface;

at least one generally square registration feature in said material surface, said at least one generally square registration feature having a bottom surface, and including a series of substantially vertically extending laterally continuous raised lines extending in a parallel manner across said at least one registration feature, and originating at said bottom surface of each of said at least one registration feature, substantially all of said raised lines having surfaces which are substantially coplanar with said material surface, said raised lines being of equal size and dimensions, and a series of trenches disposed between said raised lines within said at least one generally square registration feature, said trenches being of equal width and length, said at least one generally square registration feature comprising four rectangular elongated registration features defining said overlay target, each of said four rectangular elongated registration features including said series of substantially vertically extending laterally continuous raised lines originating at said bottom surface of said at least one registration feature, and said series of trenches disposed between said raised lines within said four rectangular elongated registration features, said four rectangular elongated registration features defining a continuous perimeter of a rectangle.

4. The overlay target of claim 3, wherein said at least one generally square registration feature includes a plurality of generally square registration features defining said overlay target, each of said plurality of generally square registration features including said series of substantially vertically extending laterally continuous raised lines originating at said bottom surface of said at least one registration feature, and said series of trenches disposed between said raised lines within said at least one generally square registration feature.

5. The overlay target of claim 4, further comprising at least one rectangular elongated registration feature including said series of substantially vertically extending laterally continuous raised lines originating at a bottom surface of said four rectangular elongated registration features.

6. A semiconductor wafer comprising:

a semiconductor substrate having a material surface; and an overlay target in said material surface, having at least three rectangular elongated registration features having adjacent sides of unequal length, said at least three rectangular elongated registration features each having a bottom surface comprising at least one series of substantially vertically extending laterally continuous raised lines originating at said bottom surface of each of said at least three rectangular elongated registration features, substantially all of said raised lines having surfaces which are coplanar with said material surface, and a series of trenches disposed between said raised lines within each of said at least three rectangular elongated registration features, said at least three rectangular elongated registration features defining a perimeter of a geometric shape, said at least three rectangular elongated registration features comprising four rectangular elongated registration features defining said overlay target, each of said four rectangular elongated registration features including said at least one series of substantially vertically extending laterally continuous raised lines originating at said bottom surface of each of said at least three registration features, and said series of trenches disposed between said raised lines within said four rectangular elongated registration features, said four rectangular elongated registration features defining a continuous perimeter of a rectangle.

7. The semiconductor wafer of claim 6, wherein said at least one series of substantially vertically extending laterally continuous raised lines is etched into said semiconductor substrate.

8. The semiconductor wafer of claim 6, wherein said at least one series of substantially vertically extending laterally continuous raised lines is etched into a material layer overlying said semiconductor substrate.

9. The semiconductor wafer of claim 6, wherein said at least one series of substantially vertically extending laterally continuous raised lines comprises a first series of raised lines disposed in a rectangular elongated registration feature, said overlay target further comprising a second series of raised lines disposed in a generally square registration feature.

* * * * *

UNITED STATES PATENT AND TRADEMARK OFFICE
CERTIFICATE OF CORRECTION

PATENT NO.        : 6,822,342 B2                                    Page 1 of 1
APPLICATION NO. : 09/996337
DATED             : November 23, 2004
INVENTOR(S)       : Pary Baluswamy et al.

It is certified that error appears in the above-identified patent and that said Letters Patent is hereby corrected as shown below:

On the title page:
In the Item (75) Inventors:         change "Scott J. DeBoer, Biose, ID (US);" to
                                    -- Scott J. DeBoer, Boise, ID (US);--
In the Item (56) References Cited:  delete "JP    58-90728    5/1983"
FOREIGN PATENT DOCUMENTS Signed and Sealed this Twenty-seventh Day of November, 2007

JON W. DUDAS
*Director of the United States Patent and Trademark Office*